US009966951B2

(12) United States Patent
Karuza et al.

(10) Patent No.: US 9,966,951 B2
(45) Date of Patent: May 8, 2018

(54) SYSTEM FOR ALLOWING A USER TO WIRELESSLY MANAGE SOFTWARE APPLICATIONS OF A COMPUTING DEVICE AND PLURALITY OF VEHICLES SENSORS

(71) Applicant: Andrew Loren Karuza, San Mateo, CA (US)

(72) Inventors: Andrew Loren Karuza, San Mateo, CA (US); Dan Luong, Seattle, WA (US); Mohammad Juma, Seattle, WA (US); Henry Wong, Mill Creek, WA (US)

(73) Assignee: Andrew Loren Karuza, Bellingham, WA (US)

( * ) Notice: Subject to any disclaimer, the term of this patent is extended or adjusted under 35 U.S.C. 154(b) by 0 days. days.

(21) Appl. No.: 15/603,891

(22) Filed: May 24, 2017

(65) Prior Publication Data
US 2017/0346487 A1    Nov. 30, 2017

Related U.S. Application Data

(60) Provisional application No. 62/340,525, filed on May 24, 2016.

(51) Int. Cl.
*G08G 1/00* (2006.01)
*H03K 17/96* (2006.01)
(Continued)

(52) U.S. Cl.
CPC ........... *H03K 17/962* (2013.01); *B60Q 9/00* (2013.01); *B60R 16/023* (2013.01); *G08C 17/02* (2013.01);
(Continued)

(58) Field of Classification Search
None
See application file for complete search history.

(56) References Cited

U.S. PATENT DOCUMENTS

| 4,403,208 A | * | 9/1983 | Hodgson | ............... G08G 1/161 |
| | | | | 340/902 |
| 5,841,367 A | * | 11/1998 | Giovanni | ................. B60Q 1/52 |
| | | | | 340/436 |

(Continued)

*Primary Examiner* — K. Wong

(57) ABSTRACT

Disclosed is a beacon for allowing a user to wirelessly manage software applications of a computing device and plurality of vehicle's sensors. The beacon includes a housing, a touch sensor to identify tap from the user, a bi-directional communication unit to wirelessly bi-directionally communicate with the computing device and the vehicle's sensors on receiving tap from the user, a memory unit to store plurality of modules and plurality of instructions, wherein each instruction corresponding to each tap and a processor coupled to the memory unit and configured in the housing to process the plurality of modules. The plurality of modules includes a computing device module opens the specific software application based upon specific number of taps received from the user; a vehicle sensor module operates a specific vehicle sensor based upon a specific number of taps receive from the user; and a vehicle sensor and computing device module opens the status of the vehicle sensor on the computing device depending upon the specific number of taps received from the user.

7 Claims, 2 Drawing Sheets

(51) Int. Cl.
*G08C 17/02* (2006.01)
*B60R 16/023* (2006.01)
*B60Q 9/00* (2006.01)

(52) U.S. Cl.
CPC .............. *H03K 2217/94089* (2013.01); *H03K 2217/96062* (2013.01); *H03K 2217/960755* (2013.01)

(56) References Cited

U.S. PATENT DOCUMENTS

| | | | |
|---|---|---|---|
| 6,696,976 B1* | 2/2004 | Hansen | G08G 1/162 340/901 |
| 7,098,804 B2* | 8/2006 | Tringali | G08G 1/0965 340/902 |
| 7,099,776 B2* | 8/2006 | King | G01C 21/26 340/902 |
| 9,008,856 B2* | 4/2015 | Ricci | G06F 9/54 455/404.1 |
| 9,604,641 B2* | 3/2017 | Al-Stouhi | B60W 30/18154 |

* cited by examiner

SYSTEM FOR ALLOWING A USER TO WIRELESSLY MANAGE SOFTWARE APPLICATIONS OF A COMPUTING DEVICE AND PLURALITY OF VEHICLES SENSORS

CROSS REFERENCE TO RELATED PATENT APPLICATION

This application claims priority to U.S. Provisional Patent Application No. 62/340,525, filed on May 24, 2016 on behalf of Karuza, et. al, the disclosure of which is incorporated herein by reference in its entirety.

BACKGROUND OF THE INVENTION

1. Field of the Invention

The present application generally relates to a system for allowing a user to wirelessly manage software applications, and more particularly relates to a system for allowing a user to wirelessly manage software applications of a computing device and plurality of vehicle's sensors.

2. Description of Related Art

With the popularity of smartphone devices, vulnerable vehicle drivers are increasingly distracted by the activities with the devices, such as listening to music, watching videos, texting, or making calls while driving on the road. Since people use these devices for voice, internet and text, many people are in constant communication and have lost their attention to events surrounding them.

Bluetooth Low Energy (BLE) is a feature of Bluetooth 4.0 wireless radio technology, aimed at new, principally low-power and low-latency, applications for wireless devices within a short range (up to 50 meters/160 feet). This facilitates a wide range of applications and smaller form factor devices.

Most vehicles are looking to connect IoT sensors through the driver's smart phone. For example, using an easy and streamlined process for launching the capability, such as backup parking sensors enabled via a license plate frame, within the smart phone.

New automotive IoT devices for example are using various sensors such as distance, infrared, camera, laser, etc., on front, back, side, top, or bottom. Automotive IoT devices typically do not wire in directly to the car and this makes it very difficult for drivers to interact directly with the device in an intuitive and convenient way from their mobile device.

Most of the cars currently use smart diagnostics that require a user to manually open the mobile software application on their smart mobile device. Further, the IoT devices require software integration in the form of a mobile application on the driver's smartphone to work.

Furthermore, each IoT device requires a separate software application that requires the driver to manually open each time by the driver would like to use it. Therefore, there is a need of a system that allows the vehicle's driver to wirelessly manage software applications of a computing device and plurality of vehicle's sensors. Furthermore, the system should be able to wirelessly integrate the software application on the computing device with the vehicle's sensor.

SUMMARY OF THE INVENTION

In accordance with teachings of the present invention, a system for allowing a vehicle's driver to wirelessly manage software applications of a computing device and plurality of vehicle's sensor is provided.

An object of the present invention is to provide a beacon for allowing a user to wirelessly manage plurality of vehicle sensor's and software applications of a computing device. The beacon includes housing, a touch sensor, a bi-directional communicational unit, a memory unit, and a processor.

The touch sensor is configured in the housing to identify tap from the user. The bi-directional communication unit is configured in the housing to wirelessly bi-directionally communicate with the computing device and the vehicle's sensor on receiving tap from the user.

The memory unit is configured in the housing to store plurality of modules, and plurality of instructions. Each instruction corresponds to each tap. The instructions correspond to either opening of a software application or operating a specific vehicle sensor or opening the status of the vehicle sensor on the computing device.

The processor is coupled to the memory unit and configured in the housing to process the plurality of modules. The plurality of modules communicates with either the vehicle's sensors or the computing device via the bi-directional communication unit. The plurality of modules includes a computing device module, a vehicle sensor module and a vehicle sensor and computing device module.

The computing device module opens a specific software application based upon specific number of taps received from the user. The vehicle sensor module operates a specific vehicle sensor based upon the specific number of taps received from the user. The vehicle sensor and computing device module opens the status of the vehicle sensor on the computing device depending upon the specific number of taps received from the user.

Another object of the present invention is to provide the beacon wherein the vehicle sensor module is further programmed to receive alert signals from the vehicle's sensor via the bi-directional communication unit. The beacon further includes at least one output unit attached to the housing.

The output unit releases output signals on receiving the alert signals from the vehicle's sensor via the bi-directional communication unit. Further, the output signals include either vibration signal or audio signal or visual signal. Another object of the present invention is to provide the beacon wherein the instructions varies with variation in intensity of each tap received from the user. The tap may be made by the user using either finger or thumb.

These and other features and advantages will become apparent from the following detailed description of illustrative embodiments thereof, which is to be read in connection with the accompanying drawings.

DETAILED DESCRIPTION OF DRAWINGS

The following detailed description is directed to certain specific embodiments of the invention. However, the invention can be embodied in a multitude of different ways as defined and covered by the claims and their equivalents. In this description, reference is made to the drawings wherein like parts are designated with like numerals throughout. Unless otherwise noted in this specification or in the claims, all of the terms used in the specification and the claims will have the meanings normally ascribed to these terms by workers in the art.

Figure 1:
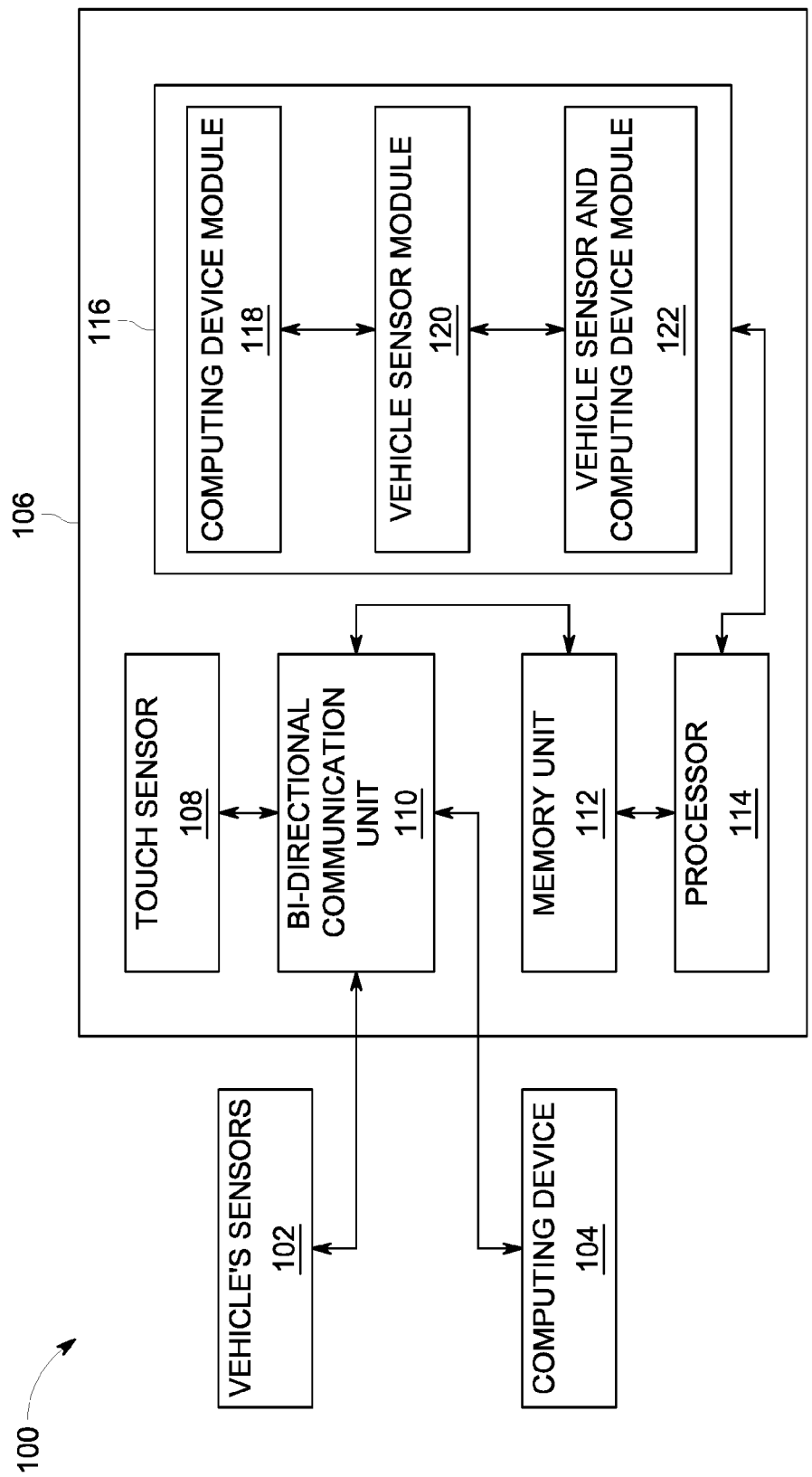
FIG. 1 illustrates a block diagram to illustrate components of a beacon in accordance with a preferred embodiment of the present invention.

FIG. 1 illustrates a block diagram to illustrate components of a beacon 100 in accordance with a preferred embodiment of the present invention. The beacon 100 allows a user to wirelessly manage plurality of vehicle's sensors 102 and software applications of a computing device 104. The beacon 100 includes a housing 106, a touch sensor 108, a bi-directional communication unit 110, a memory unit 112, and a processor 114.

Figure 2:
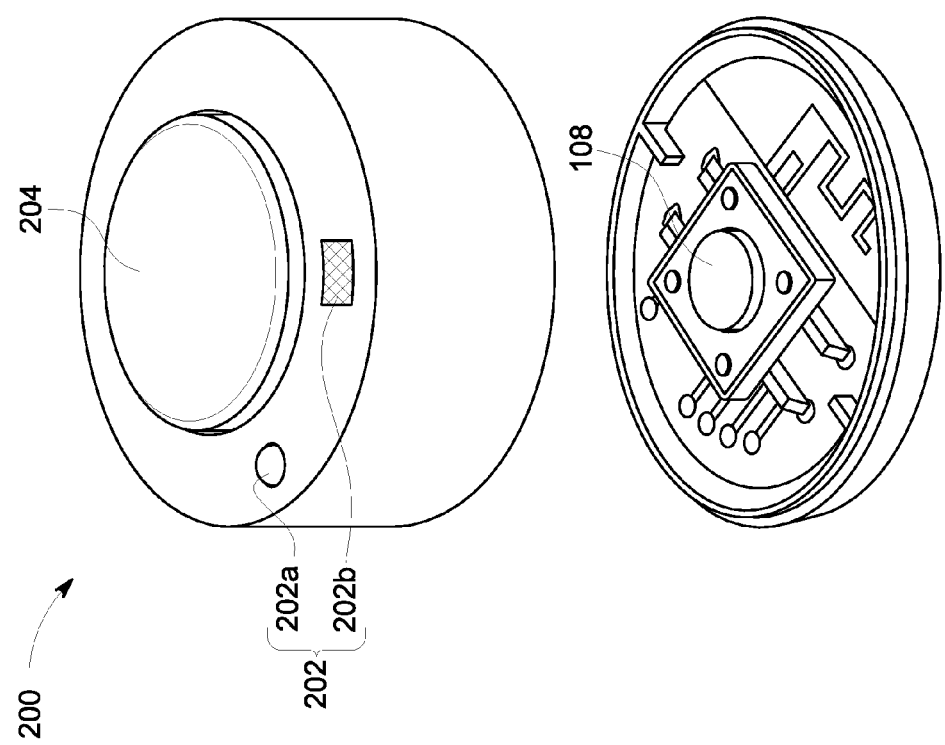
FIG. 2 illustrates a partial exploded view of a beacon in accordance with another preferred of the present invention.

The housing 106 is explained in detailed in conjunction with FIG. 2 of the present invention. The touch sensor 108 is able to identify tap from the user. In another preferred embodiment of the present invention, the touch sensor 108 is further able to identify the intensity of the tap from the user. The intensity here refers to duration of the tap from the user.

The bi-directional communication unit 110 is configured in the housing 106 to wirelessly bi-directionally communicate with the computing device 104 and the vehicle's sensor 102 on receiving tap from the user. Examples of the bi-directional communication unit 110 include but not limited to a low energy Bluetooth, internet, wi-fi, or any other similar wireless communication devices.

The memory unit 112 is configured in the housing 106 to store plurality of modules 116 and plurality of instructions. Each instruction corresponds to each tap. The instructions correspond to either opening of a software application or operating a specific vehicle sensor or opening the status of the vehicle sensor on the computing device.

Examples of the memory unit 112 include but not limited to flash memory, random access memory, read only memory, cache memory etc. Examples of the processor 114 include but not limited to microcontroller, microprocessor etc.

The processor 114 is coupled to the memory unit 112 and further configured to process the plurality of modules 116. The plurality of modules 116 communicates with either the vehicle's sensors 102 or the computing device 104 via the bi-directional communication unit 110. The plurality of modules 116 includes a computing device module 118, a vehicle sensor module 120 and a vehicle sensor and computing device module 122.

The computing device module 118 opens a specific software application based upon specific number of taps received from the user. The software applications are opened in the computing device 104. The computing device 104 may belong to the vehicle's driver. This is to ensure safe driving of the vehicle and the driver is able to open specific software applications using tap.

For exemplary purposes, the functioning of the computing device module 118 is shown below:

| Number of Taps | Software Application |
| --- | --- |
| 1 tap | Facebook |
| 2 taps | GPS Map |
| 3 taps | Whatsapp |
| 4 taps | Instant SMS Message |
| 10 taps | Playing a playlist from the media player |

The vehicle sensor module 120 operates a specific vehicle sensor based upon the specific number of taps received from the user. The user is able to send commands to the vehicle's sensor 102 through the bi-directional communication unit 110. This ensures that the driver is able to send commands to the vehicle's sensor 102 to communicate their status over the communication network.

For exemplary purposes, the functioning of the vehicle sensor module 120 is shown below:

| Number of Taps | Vehicle's Sensor |
| --- | --- |
| 5 taps | Rear Camera |
| 6 taps | Collision Analysis Sensor |

The vehicle sensor and computing device module 122 opens the status of the vehicle's sensor 102 on the computing device 104 depending upon the specific number of taps received from the user. This ensures that the user is able to view status of each vehicle's sensor 102 on the computing device 104 directly with just few clicks on the touch sensor 108.

The user does not need to concentrate on the display unit of the computing device to operate the software application while driving. The tap on the touch sensor 108 ensures opening of the selective vehicle's sensor 102 on the computing device 104. For exemplary purposes, the functioning of the vehicle sensor module 120 is shown below:

| Number of Taps | Software Application |
| --- | --- |
| 7 taps | Opening of the rear camera on the computing device |
| 8 taps | Opening of Collision Analysis |

In another preferred embodiment of the present invention, the vehicle sensor module 120 is programmed to receive alert signals from the vehicle's sensor 102 via the bi-directional communication unit 110. The alert signals are explained in detail in conjunction with FIG. 2 of the present invention.

Examples of the vehicle's sensors 102 include but not limited to camera sensor, tire pressure sensor, temperature sensor, ultrasonic sensor, navigational sensor, and a vibration sensor. Examples of the computing device 104 include but not limited to smartphone, ipad, tablet etc. In a preferred embodiment of the present invention, the user is vehicle's driver.

FIG. 2 illustrates a partial exploded view of a beacon 200 in accordance with another preferred of the present invention. The beacon 200 further includes at least one output unit 202 such as light emitting diode 202a, and an audio unit 202b. The audio unit 202b is a speaker to produce sound to alert the user.

The light emitting diode 202a emits light on receiving alert signals from the vehicle's sensors via the bi-directional communication unit. The audio unit 202b releases sound or vibration signals on receiving alert signals from the vehicle's sensors via the bi-directional communication unit. With reference to FIG. 1 the vehicle sensor module processes the alert signals to emit either light, audio or vibration signals.

For exemplary purposes, the vehicle is moved from the parked location. The sensor then sends a theft signal to the bi-directional communication unit. The bi-directional communication unit then sends the information to the vehicle sensor module. Thereafter, the output unit 202 generates output signals through either the light emitting diode or the audio unit on receiving command from the vehicle sensor module.

In a preferred embodiment of the present invention, the housing 102 is round shaped. It would be readily apparent to those skilled in the art that various shapes of the housing 102 may be envisioned without deviating from the scope of the present invention.

The housing 102 contains a touch button 204 that transfers the touch sensation to the tap sensor 108. In a preferred embodiment of the present invention, the touch sensor 108 is a capacitive sensor. It would be readily apparent to those skilled in the art that various types of touch sensor 108 may be envisioned without deviating from the scope of the present invention.

The present invention offer various advantages such as hands-free way to operate apps and smart car devices while driving, so driver's can enjoy new car technology, while driving safe. The present invention further provides the simplest UI possible to command and control software applications and the connected vehicle's sensor devices with a series of taps. Further, the present invention speeds up the process of finding such applications without having to touch the smartphone, and having it launch instantly.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

The invention claimed is:

1. A beacon system for allowing a user to wirelessly manage plurality of vehicle's sensors and software applications of a computing device, the beacon system comprising:
   a housing;
   a touch sensor configured in the housing to identify tap from the user;
   a bi-directional communication unit configured in the housing to wirelessly bi-directionally communicate with the computing device and the vehicle's sensors on receiving tap from the user;
   a memory unit configured in the housing to store plurality of modules, and plurality of instructions, wherein each instruction corresponding to each tap; and
   a processor coupled to the memory unit and configured in the housing to process the plurality of modules, wherein the plurality of modules to communicate with at least one of the vehicle's sensors; and the computing device via the bi-directional communication unit, wherein the plurality of modules comprising:
   a computing device module opens predefined software application on the computing device based upon specific number of taps received on the housing from the user;
   a vehicle sensor module operates a predefined vehicle sensor based upon the specific number of taps received on the housing from the user; and
   a vehicle sensor and computing device module opens the status of the vehicle sensor on the computing device depending upon the specific number of taps received on the housing from the user;
   wherein the instruction corresponds to at least one of: opening of a software application; operating of a specific vehicle sensor; and opening the status of the vehicle sensor on the computing device.

2. The beacon system according to claim 1 wherein the user taps the touch sensor using at least one finger, wherein the touch sensor generates a pre-defined instruction for at least one of the vehicle sensor module; and vehicle sensor and computing device module, wherein the pre-defined instruction varies with the number of fingers used for taping.

3. The beacon system according to claim 2 wherein the user taps the touch sensor using thumb, wherein the touch sensor generates another pre-defined instruction different from the generated pre-defined instruction for at least one of the vehicle sensor module; and vehicle sensor and computing device module.

4. The beacon system according to claim 1 wherein the vehicle sensor module further programmed to receive alert signals from the vehicle's sensor via the bi-directional communication unit.

5. The beacon system according to claim 1 wherein the system further comprising at least one output unit attached to the housing, wherein the output unit releases output signals on receiving the alert signals from the vehicle's sensor via the bi-directional communication unit.

6. The beacon system according to claim 5 wherein the output signals comprising at least one of: vibration signal; audio signal; and visual signal.

7. The beacon system according to claim 1 wherein the instructions varies with variation in intensity of each tap received from the user.

* * * * *